United States Patent
Dulka et al.

(10) Patent No.: US 6,630,202 B1
(45) Date of Patent: Oct. 7, 2003

(54) CVD TREATMENT OF HARD FRICTION COATED STEAM LINE PLUG GRIPS

(75) Inventors: Catherine Procik Dulka, West Chester, PA (US); James Burner, Downingtown, PA (US); John Ackerman, Laramie, WY (US); Richard Oran Kilgo, Philadelphia, PA (US); Edwin R. Baker, Exton, PA (US); Gail Dunning, Sunnyvale, CA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/259,388

(22) Filed: Sep. 30, 2002

(51) Int. Cl.[7] ................................................ C23C 16/40
(52) U.S. Cl. ........................ 427/255.29; 427/255.12; 427/900
(58) Field of Search ................... 427/255.29, 255.12, 427/900

(56) References Cited

U.S. PATENT DOCUMENTS

| | | | | |
|---|---|---|---|---|
| 4,470,946 A | * | 9/1984 | Vassalotti et al. | 376/204 |
| 4,584,162 A | * | 4/1986 | Yoli | 376/204 |
| 5,295,458 A | * | 3/1994 | Baversten | 122/504 |
| 5,349,614 A | * | 9/1994 | Bruner | 376/204 |
| 5,522,432 A | * | 6/1996 | Radant et al. | 138/93 |
| 5,705,225 A | * | 1/1998 | Dornfest et al. | 427/248.1 |
| 5,789,027 A | * | 8/1998 | Watkins et al. | 427/250 |
| 6,058,153 A | * | 5/2000 | Kurosawa et al. | 376/249 |
| 6,448,187 B2 | * | 9/2002 | Yau et al. | 438/758 |

* cited by examiner

Primary Examiner—Bret Chen
(74) Attorney, Agent, or Firm—Nixon & Vanderhye

(57) ABSTRACT

Method of treating a surface of a steam line plug grip wherein the surface is subjected to chemical vapor deposition (CVD) treatment to introduce a hard oxide material into pores and cracks in the surface.

5 Claims, 6 Drawing Sheets

CVD TREATMENT OF HARD FRICTION COATED STEAM LINE PLUG GRIPS

The present invention relates to reduction or elimination of corrosion of hard-friction coated aluminum steam line plug grips.

BACKGROUND OF THE INVENTION

Steam line plug grips are the essential component used to maintain the purchase of the plug to the nozzle inside diameter and actuate the primary seal O-ring. The design of the grip surface greatly affects the ability of the plug to hold against downstream LLRT test pressure. The grips are made from a high strength aluminum base material and its flat surface has a hard friction coating.

When the grips are removed from service and stored after the outage, the coating tends to delaminate. Subsequent investigation has revealed that the moisture retained in the porosity of the coating after removal from service causes the corrosion of the aluminum base material which results in delamination of the hard friction coating.

One approach to the above problem has been to apply an over coat of penetrant Loctite sealant to the hard friction coating. However, this has not been satisfactory and only a temporary solution at best. The Loctite sealant is an organic material which degrades with time and eventually flakes from the surface.

A need exists to more effectively deal with the porosity of the hard friction coating of steam line plug grips. The present invention seeks to meet that need.

BRIEF DESCRIPTION OF THE INVENTION

It has now been discovered surprisingly that it is possible to treat the hard friction surface of steam line plug grips with a hard oxide material using CVD in order to fill pores and cracks with CVD material. Surfaces so treated do not readily degrade with use and equipment maintenance is reduced and simplified.

In one aspect, the present invention provides a method of treating a surface of a steam line plug grip comprising subjecting the surface to chemical vapor deposition (CVD) treatment to introduce a hard oxide material into pores and cracks in the surface.

In a further aspect, there is provided a steam line plug grip having at least one CVD treated surface wherein hard oxide material is deposited in pores and cracks of the surface.

Advantages arising from the CVD treatment are that it fills in the pores of the hard friction coating with a hard oxide material, such as for example tantala, titania, silica, or alumina, or other similar oxide which does not readily degrade in use. In addition, the CVD treatment is a conformal surface treatment rather than line of sight, and covers the entire surface thereby allowing for covering the hard friction surface and filling in the pores and cracks with the CVD material. Moreover, the CVD treatment is not a limiting process in that no contaminants come off the surface. There is no delamination of materials from the surface, which is particularly advantageous for components used in a nuclear reactor, such as a BWR or PWR, where contamination of the reactor water is to be avoided. A further important feature is that there is a substantial reduction in corrosion due to the fact the CVD process results not just in coverage of the surface but filling of the pores and cracks, thereby preventing or significantly reducing entry of moisture under the coating.

DETAILED DESCRIPTION OF THE INVENTION

Figure 1A:
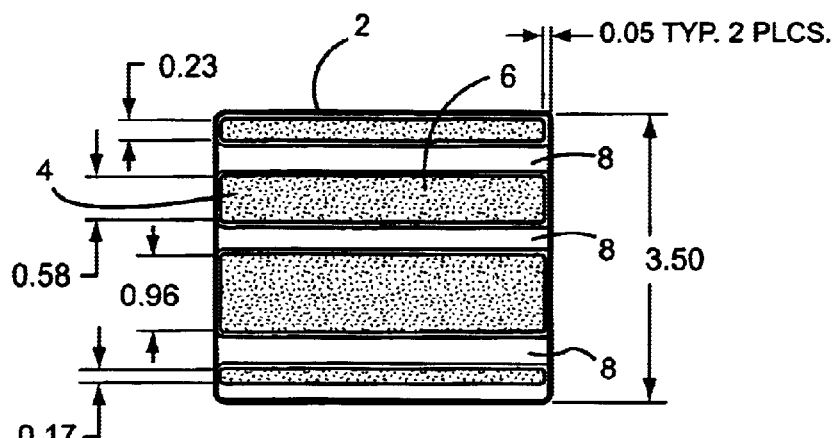
FIGS. 1A, 1B and 1C show a steam line plug grip with a hard friction coating and the CVD treatment.
Figure 1B:
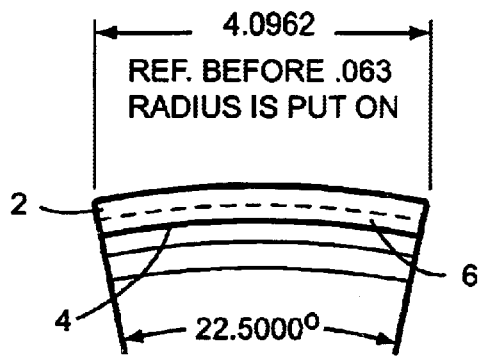
Figure 1C:
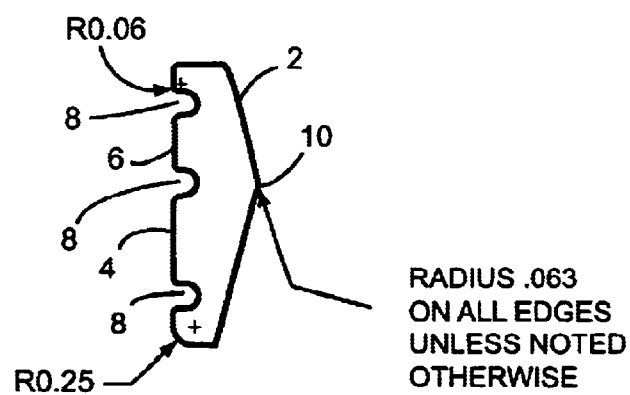

Referring to FIG. 1, there is shown an aluminum steam line plug grip 2 with a hard friction coating 4. The grip is curved as shown in plan view in the figure, and contains grooves 8 extending along the length thereof. The grip in end view has a generally triangular shape with an apex 10, as shown in the figure.

The grip is subjected to CVD treatment to introduce hard oxide 6 onto the friction coating 4. Generally, the oxide material has a hardness (on the Rockwell C scale) of higher than 50, more usually in the range of 60–70. Typically, the oxide material is selected from tantala, titania, silica and alumina. However, this list is not exclusive and other oxide materials falling within the above hardness range may be employed.

The steam line plug grip formed according to the present invention has at least one CVD treated surface wherein oxide material is deposited in pores and cracks of the surface. A surprising feature is the depth to which the CVD material penetrates, typically 3–8 mils below the surface, for example about 5 mils. Typically, cracks are less than about 0.2 mils wide, for about 0.16 mils wide. The oxide material is generally present as a continuous layer on the surface, with a thickness of 1–5 microns, more usually 1–3 microns.

A steamline plug grip design with the hard friction coating provides for the hold against a pressure of 200+ psig. It also allows for reducing the actuation torque required to hold the plug against the test pressures. Because of the inherent porosity in the coating, the CVD treatment as shown in FIG. 1 fills the voids and protects the base aluminum from corrosion. As a result of the CVD treatment, the base aluminum material is protected from moisture contamination and the resulting corrosion and loss of the hard friction coat.

Figure 2A:
FIGS. 2A, 2B and 2C show the results of a 24 hour salt spray test and indicate the CVD sample outperformed the baseline sample and the Loctite coated sample with regard to degree of corrosion. The white blotches in the photos are the corrosion products of the base aluminum.
Figure 2B:
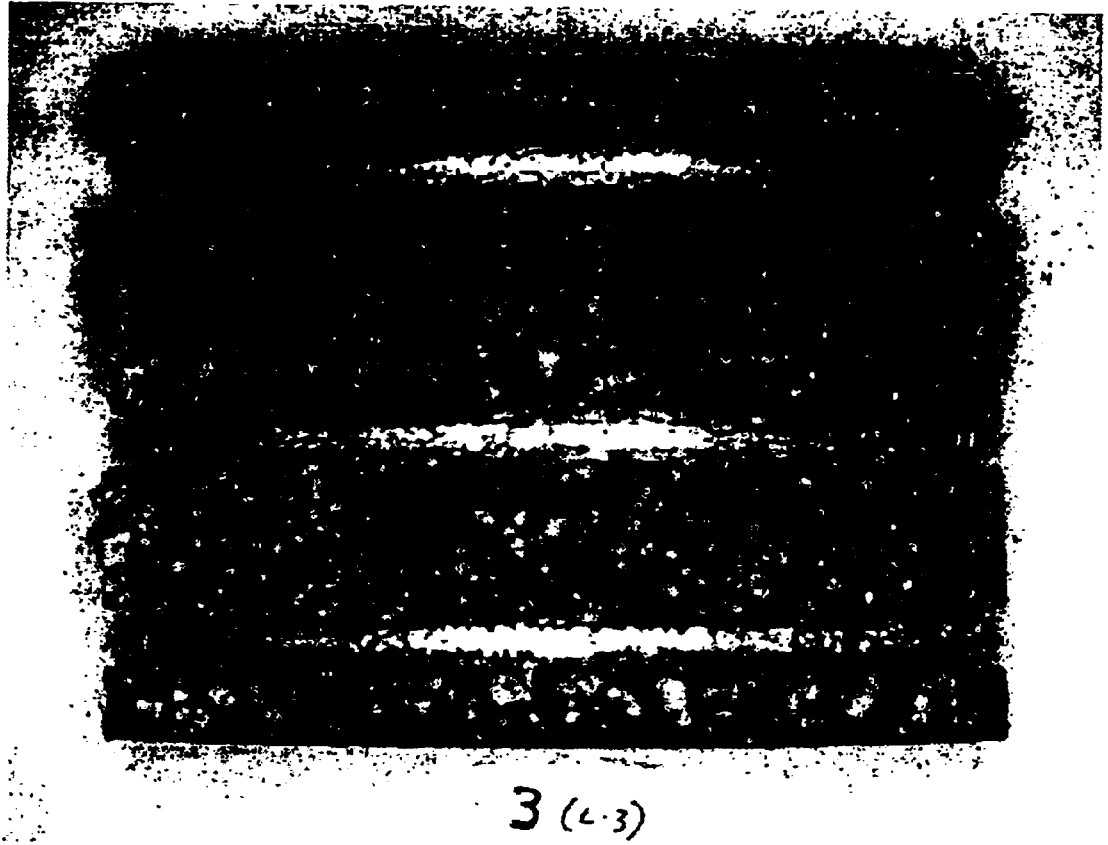
Figure 2C:
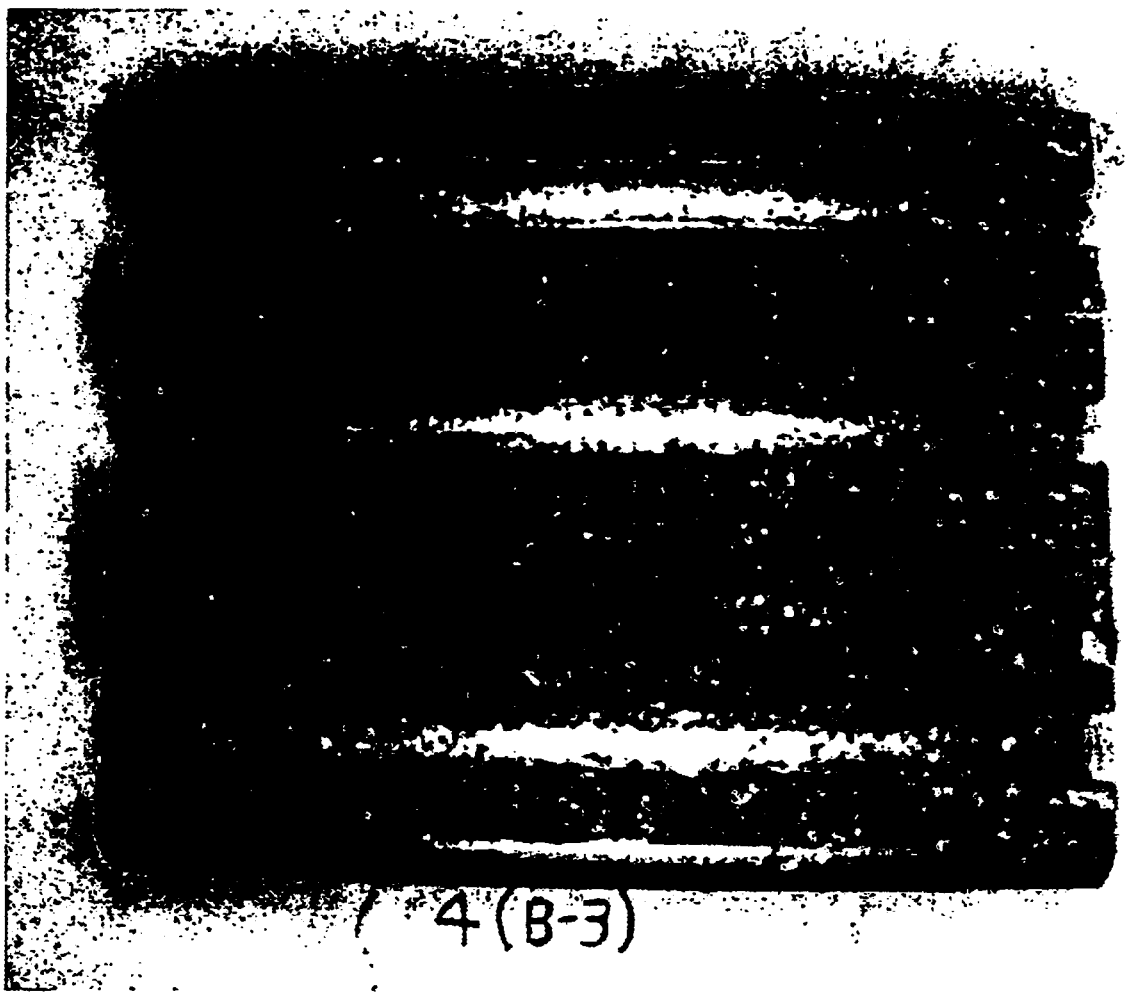
Figure 3:
FIG. 3 is a photomicrograph of a cross section of the CVD sample showing the 1 micron layer of the grey tantala coating on the surface of the friction coat.

Referring to FIGS. 2A, 2B and 2C, there is shown the results of a 24 hour standard salt spray test (ASTM B117 1995) and indicate the CVD sample outperformed the baseline sample and the Loctite coated sample with regard to degree of corrosion. The white blotches in the photos are the corrosion products of the base aluminum In FIG. 3, there is shown a photomicrograph of a cross section of the CVD sample. The micrograph shows a 1 micron layer of the grey tantala coating on the surface of the friction coat.

Figure 4:
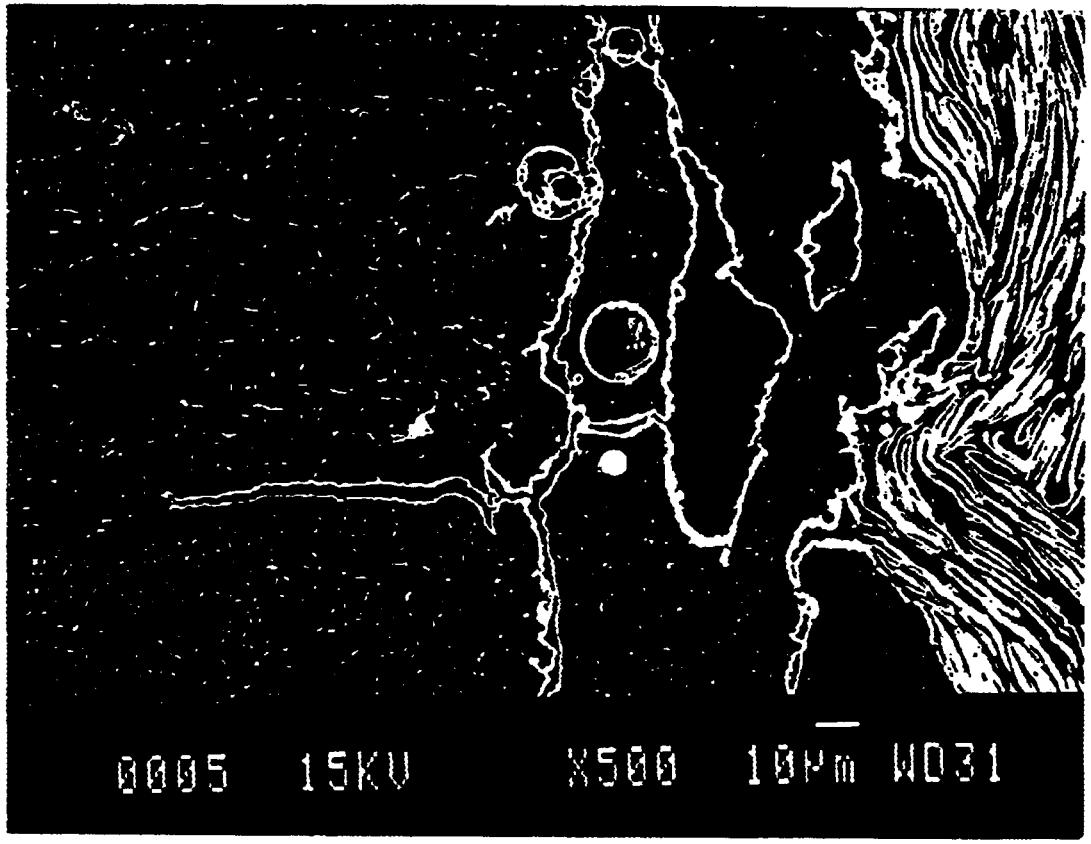
FIG. 4 is a backscatter electron micrograph of the cross section of the CVD sample showing how the tantala penetrates and coats the pores and voids in the friction-coated surface.

FIG. 4 shows a backscatter electron micrograph of the cross section of the CVD sample. The figure shows how the tantala penetrates and coats the pores and voids in the friction-coated surface. The tantala has coated the walls of the cracks to a depth of at least 110 microns (i.e. at least 4.3 mils). Some of the cracks have been completely filled with the tantala. In several areas where there are voids, the tantala has completely coated the walls of the voids. The curved thin material to the right of the SEM photo is copper mounting material to allow electrical conductivity of the sample.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. Method of treating a surface of a steam line plug grip comprising subjecting the surface to chemical vapor deposition (CVD) treatment to introduce an oxide material into pores and cracks in the surface.

2. Method according to claim 1, wherein said oxide material is selected from the group consisting of tantala, titania, silica and alumina.

3. Method according to claim 1 wherein said oxide material covers the entirety of said surface.

4. Method according to claim 1 wherein said oxide material is present as a continuous layer on said surface.

5. Method according to claim 4 wherein said layer has a thickness of 1–5 microns.

* * * * *